United States Patent [19]

Hepworth

[11] Patent Number: 4,572,966
[45] Date of Patent: Feb. 25, 1986

[54] ACTIVITY MONITOR, POWER-ON CLEAR CIRCUIT

[75] Inventor: Mark N. Hepworth, Cedar Rapids, Iowa

[73] Assignee: Rockwell International Corporation, El Segundo, Calif.

[21] Appl. No.: 564,809

[22] Filed: Dec. 22, 1983

[51] Int. Cl.[4] .............................................. H03K 3/023
[52] U.S. Cl. ............................... 307/200 A; 307/269; 307/273; 307/593; 307/603
[58] Field of Search ........... 307/200 A, 494, 517–518, 307/246, 573, 269, 273, 592–593, 597, 603, 605, 608; 364/186, 200 MS File, 900 MS File; 371/12

[56] References Cited

U.S. PATENT DOCUMENTS

| | | | |
|---|---|---|---|
| 3,894,247 | 7/1975 | De Jong | 307/592 |
| 4,234,920 | 11/1980 | Van Ness et al. | 307/200 A X |
| 4,245,150 | 1/1981 | Driscoll et al. | 307/200 A X |
| 4,254,472 | 3/1981 | Juengel et al. | 364/900 |
| 4,367,422 | 1/1983 | Leslie | 307/592 X |
| 4,414,623 | 11/1983 | Davis et al. | 364/200 |
| 4,433,390 | 2/1984 | Carp et al. | 307/200 A X |
| 4,434,403 | 2/1984 | Chang | 307/518 X |
| 4,446,437 | 5/1984 | Rinaldi | 307/518 X |
| 4,464,584 | 8/1984 | Hentzschel et al. | 307/592 X |
| 4,466,074 | 8/1984 | Jindrick et al. | 307/200 A X |

Primary Examiner—Stanley D. Miller
Assistant Examiner—D. R. Hudspeth
Attorney, Agent, or Firm—Robert C. Mayes; George A. Montanye; H. Fredrick Hamann

[57] ABSTRACT

A power-on clear circuit is disclosed with a repetitive reset output for use with a microprocessor having a "heartbeat" activity monitor. The reset output is repeated at specified intervals until the activity monitor is sensed, at which time the reset output is disabled until the activity monitor is no longer detected.

1 Claim, 1 Drawing Figure

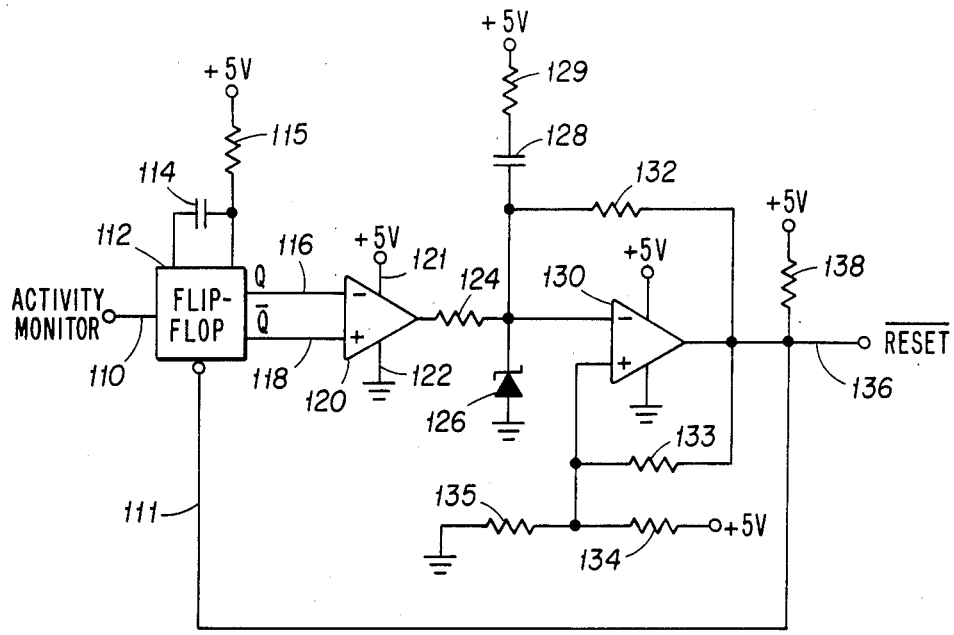

ACTIVITY MONITOR, POWER-ON CLEAR CIRCUIT

BACKGROUND OF THE INVENTION

This invention relates to electronic reset circuits in general and more particularly to power-on clear reset circuits for use with microprocessor-controlled apparatus.

The need for a power-on clear circuit in a microprocessor or other logic dependent circuits has been met in a variety of ways to enable the user to know the "state" of each of the logic circuits in the apparatus upon power-up. This capability is necessary to prepare the microprocessor or logic circuit to receive the first set of data/instructions and begin to perform its function.

With typical prior art reset circuits, the reset pulse is triggered by a power-on situation and thereafter the microprocessor will transmit a "heartbeat" activity monitor pulse which disables the reset circuitry during periods of reception of the pulse. Upon failure during a predetermined time period to receive the activity monitor signal, a typical power-on clear circuit with activity monitor capability will transmit a reset pulse to the microprocessor thereby enabling functions to begin again.

A somewhat improved power-on restart circuit such as that described in Samuel A. Leslie U.S. Pat. No. 4,367,422 additionally has the capability of issuing a reinitializing reset signal in response to low voltage power supply transients, essentially similar in function to the circuit described in James S. Thomas U.S. Pat. No. 4,296,338. However, a single reset or initialization pulse under a slowly building voltage condition or a constant low voltage situation will not restart the microprocessor and will tend to cause a lock-up condition for the apparatus. Additional useful background material is contained in the following U.S. Pat. Nos.: Yoichi Imamura 4,103,187; Shinichi Tanaka 4,140,930; Fuad H. Musa et.al. 4,224,539; and Joseph P. Winebarger 4,260,907. Each of the above-identified U.S. patent documents are hereby incorporated by reference thereto.

A significant problem has been noted in the art in that the power supply, in some applications, may tend to build voltage at a relatively slow rate and trigger the reset circuit prior to having sufficient voltage applied to the microprocessor to provide proper operation. In this condition, the reset pulse has no effect on the microprocessor and the reset circuitry as well as microprocessor become effectively frozen until power is removed and again applied to reset the circuitry.

A similar situation occurs during a "brown-out" type situation when the supplied power drops below that required for the microprocessor, disabling the microprocessor function, and a reset pulse is immediately transmitted. In such cases the reset pulse will have no effect and once again the system becomes locked until power is removed and reapplied. This is typically accomplished by turning the circuit breaker or the power switch to the microprocessor off, and then on again.

SUMMARY AND BRIEF DESCRIPTION OF THE DRAWING

Accordingly, it is an object of the present invention to provide a power-on clear reset circuit having an activity monitor capability and further capable of emitting a series of reset pulses continuously until the activity monitor signal is reestablished.

Another object of the present invention is to provide an activity sensing circuit for a microprocessor capable of emitting a series of reset pulses upon failure to detect appropriate signal activity, and disabling the reset circuit upon reestablishment of the appropriate activity signal.

Briefly, and in accordance with the present invention, a circuit for clearing a microprocessor apparatus having a regular activity monitor signal output comprises a first timing means for receiving the activity monitor signal, and responsive thereto to prevent a microprocessor apparatus reset signal, and a second timing circuit means responsive to said first timing means and coupled thereto for issuing a plurality of reset signals as a function of the output of the first timing means and for a duration defined by the second timing means. The series of reset signals are output at a frequency low enough to enable the first timing means to receive an activity monitor signal, which then disables the second timing circuit from issuing additional reset signals.

In this manner, the continuous activity monitor signal disables the reset function until an appropriate activity monitor signal is not received during a predetermined time period as defined by the first timing means. At this time a first reset signal is emitted to initialize the microprocessor apparatus. Thereafter a quiescent period is allowed enabling the microprocessor apparatus to issue an appropriate activity monitor signal. If no activity monitor signal is received, a second and if required additional reset signals are issued with quiescent periods between each, in an attempt to reestablish proper functioning of the microprocessor apparatus.

Additional advantages and features of the present invention will become apparent upon reference to the drawing in which a schematic circuit diagram of one embodiment of the present invention is shown.

DETAILED DESCRIPTION OF THE INVENTION

Referring now to the drawing, activity monitor input 110 is for connection to a microprocessor apparatus having a "heartbeat" monitor programmed into its normal operation. The timing of the monostable multivibrator (flip-flop) 112 is controlled with capacitor 114 and resistor 115 to provide an unstable period for the flip-flop 112 subsequent to being triggered by an activity monitor pulse on line 110. This unstable period allows a second activity monitor pulse to retrigger the flip-flop 112, to remain in the unstable condition. The flip-flop 112 outputs 116 and 118 are input into an open collector comparator 120 having a five volt power supply on line 121 and coupled to ground 122.

The output of comparator 120 is provided across resistor 124 to the input of comparator 130 and, during the period that flip-flop 112 is continuously receiving activity monitor pulses on line 110 prior to returning to its stable condition, the comparator 120 output disables comparator 130 from issuing a reset pulse on line 136, as a function of the timing characteristic defined by the RC constant of resistor 115 and capacitor 114.

The timing characteristic of comparator 130 is controlled by selecting capacitor 128, resistor 129, and resistor 132 in such a manner that a response to a pulse received from comparator 120 will be a reset pulse of sufficient duration to provide positive reset capability to the attached microprocessor apparatus (not shown).

Additionally, line 111 is coupled to the reset output 136 and to the flip-flop 112 to retrigger the flip-flop 112 to its stable condition, thereby initializing the flip-flop itself into a condition allowing a full duration reset pulse to issue. Without this capability, the flip-flop 112 may occasionally power-up in its unstable condition, thereby limiting the duration of the reset pulse initially issued by comparator 130, causing a conflict in the operation of the power-on circuit. This is prevented by coupling the reset output (active low) to flip-flop 112 thereby mandating a stable condition for the flip-flop, and preventing operational contention in the power-on clear circuit when it is initially powered up.

As previously described, the flip-flop 112 will not be allowed to return to its stable condition if during the quiescent period subsequent to a reset pulse issuance, an activity monitor pulse is received on line 110. If, however, the flip-flop 112 does not receive a pulse on line 110, it subsequently will time out, returning to its stable condition, thereby causing comparator 120 to trigger comparator 130 into issuing a subsequent reset pulse.

Resistors 133, 135, 134 are utilized to provide a voltage reference for comparator 130 having feedback from reset output 136. Diode 126 provides a high speed discharge path for capacitor 128, therefore allowing rapid reset pulse issuance capability for the circuit should a power supply fluctuation occur. Resistor 129 is a current limiting resistor for operation in conjunction with the rapid discharge capability for capacitor 128. Thus, when the +5 volt power supply applied to the power-on clear circuit in this exemplary embodiment is removed temporarily, capacitor 128 rapidly discharges, and thus comparator 130 and its associated components are in the proper electrical configuration for issuance of a reset pulse very shortly after power is reapplied to the reset circuitry.

Resistor 138 is a pull-up resistor allowing proper signal level matching to TTL logic levels as is known in the art. The reset output 136 is an active low signal and as previously described is coupled back to flip-flop 112 for holding a stable condition on flip-flop 112 for the duration of the reset signal. Thus, it can be seen that the monostable multivibrator 112 is maintained, during normal operation, in its unstable state so long as activity monitor pulses are received on line 110. Comparators 120 and 130 are controlled by the monostable multivibrator 112 and designed, together with the associated circuit components, to provide a series of reset pulses of sufficient duration and current capability to provide positive reset function to an attached microprocessor apparatus. Feedback line 111 retriggers the monostable multivibrator 112 in response to a reset pulse issuance from comparator 130 to initialize the monostable multivibrator 112 in its stable condition, thereby allowing a full duration reset pulse to be issued when power is initially applied to the power-on clear circuit. The reset pulses are issued repeatedly until an activity monitor signal is received or until power to the power-on clear circuit is removed.

The timing characteristic defined by resistor 115 and capacitor 114 is coordinated with the software program of the associated microprocessor apparatus in such a manner so that an activity monitor pulse is issued at a frequency typically 10-15% greater than the RC timing characteristic. Additionally, the reset output 136 may be buffered and amplified to provide an initialization signal of sufficient power and duration to effectively initialize the microprocessor apparatus and each of its associated peripherals, essentially simultaneously.

While the present invention has been described with reference to a specific embodiment, it can be readily seen that various implementations of the present invention may become obvious to those skilled in the art upon reference to the drawing and specification. The description is intended to be merely exemplary, and it is therefore contemplated that the appended claims will cover any such modification or alternative embodiment within the true scope of the invention.

What is claimed is:

1. A power-on clear circuit for an apparatus having an activity monitor capability comprising:
   a. a monostable multivibrator having a predetermined unstable timing characteristic, for monitoring activity of said apparatus;
   b. a first open collector comparator coupled to the output of said multivibrator for sensing its output; and
   c. a second open collector comparator coupled to the output of said first comparator and having a second timing characteristic for issuing a series of reset pulses at an output, the duration of each reset pulse a function of said second timing characteristic, and issuing during the stable condition of said monostable multivibrator; said reset signal input to said multivibrator for initializing said multivibrator, thereby allowing a full duration reset pulse to issue.

* * * * *